United States Patent [19]
McFarland et al.

[11] Patent Number: 5,894,163
[45] Date of Patent: Apr. 13, 1999

[54] DEVICE AND METHOD FOR MULTIPLYING CAPACITANCE

[75] Inventors: Duncan A. McFarland, Tempe; David C. Crohn, Phoenix, both of Ariz.

[73] Assignee: Motorola, Inc., Schaumburg, Ill.

[21] Appl. No.: 08/639,479

[22] Filed: Apr. 2, 1996

[51] Int. Cl.$^6$ ................................................ H01L 29/00
[52] U.S. Cl. ......................... 257/532; 257/393; 257/271
[58] Field of Search ............................ 257/532, 271, 257/393

[56] References Cited

U.S. PATENT DOCUMENTS 5,606,197  2/1997  Johansson et al. ................. 257/532

*Primary Examiner*—Mahshid D. Saadat
*Assistant Examiner*—S. V. Clark
*Attorney, Agent, or Firm*—Robert F. Hightower; Robert D. Atkins; Gary W. Hoshizaki

[57] ABSTRACT

A semiconductor device (400) and method are provided for multiplying a capacitance. A contact region (402) is formed in an island in a semiconductor substrate (499) bounded by an isolation region (403), producing the capacitance at the junction of the contact region (402). A dielectric layer (404) is formed over the semiconductor substrate (499) adjacent to the contact region (402). A contact layer (408) is formed over the dielectric layer (404) wherein an inversion layer (406) is formed under the contact layer (408), producing an inversion capacitance in response to an enabling signal. The inversion capacitance corresponds to a multiple of the capacitance.

17 Claims, 3 Drawing Sheets

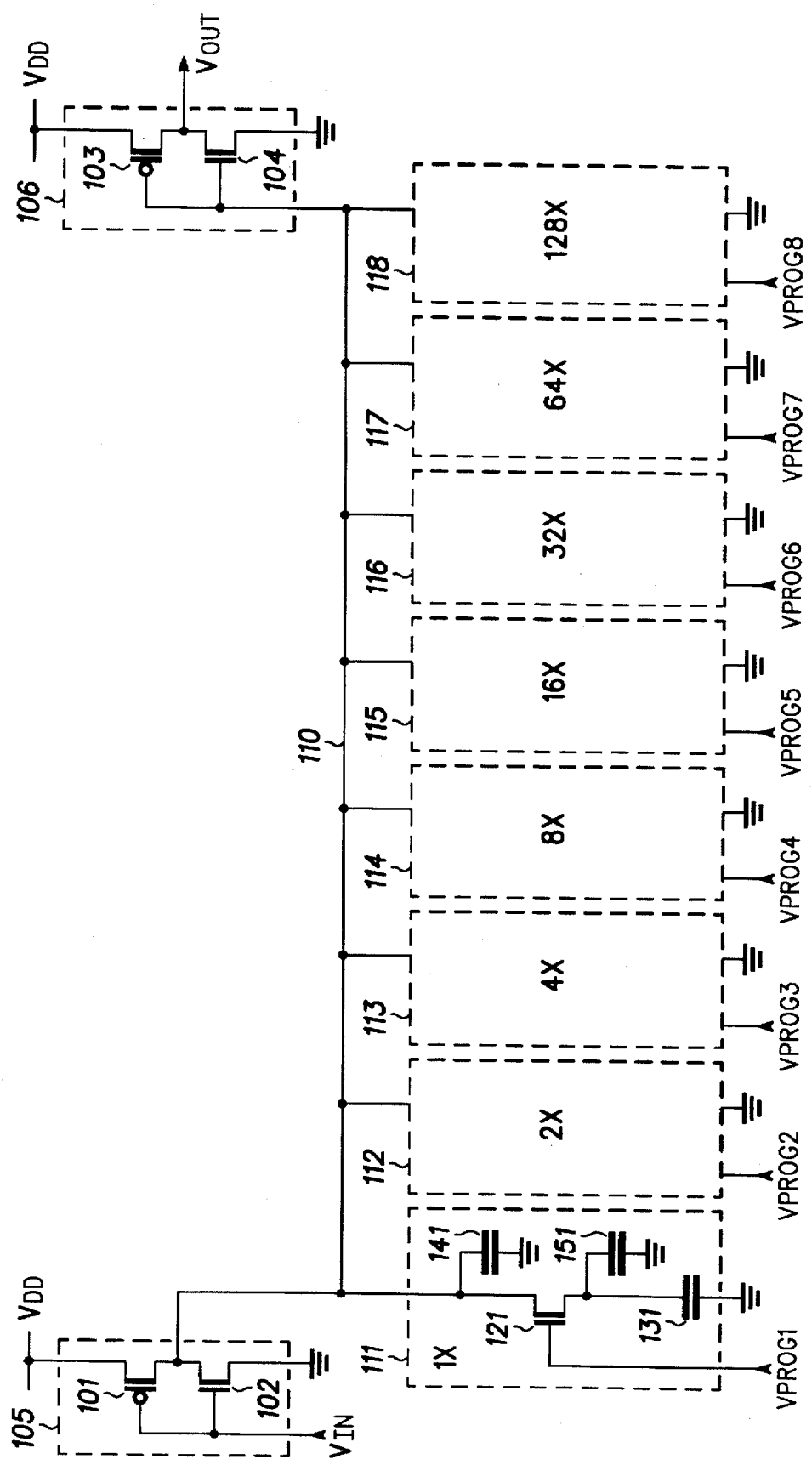
FIG. 1 - PRIOR ART -

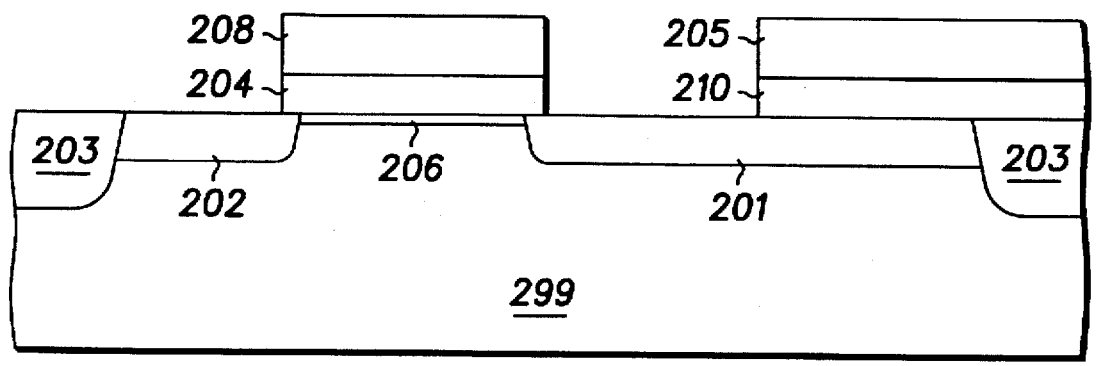
*FIG. 2 - PRIOR ART -*
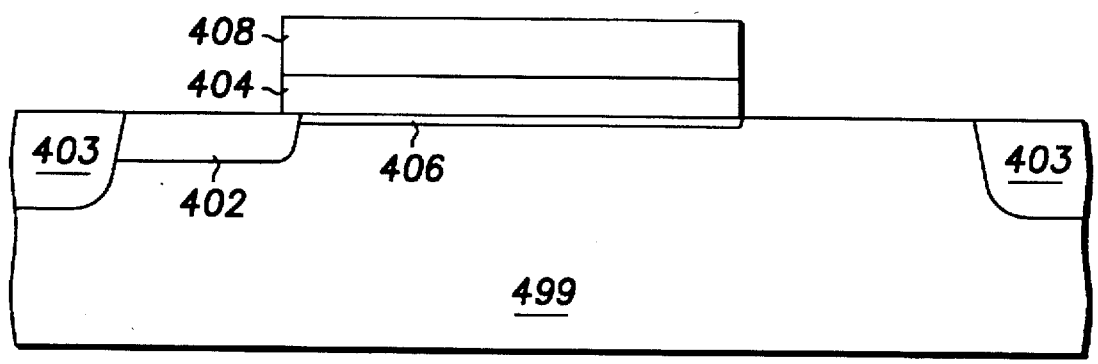
*FIG. 4*

1

DEVICE AND METHOD FOR MULTIPLYING CAPACITANCE

BACKGROUND OF THE INVENTION

This invention relates, in general, to programmable delay circuits, and more particularly to semiconductor capacitance devices.

Fiber channel is an integrated system of specifications for high speed network communication. Communications between network nodes are based on protocol and hardware standards designed for synchronous high speed data transfers at a fixed rate of 1.0625 gigabits per second. A fiber channel network has no system master clock as such so each node provides an oscillator for producing its own transmission timing signals. These localized oscillators are generally crystal controlled and tuned to 106.25 megahertz. Phase shifting circuits produce the bit interval timing signals for sending data at the specified 1.0625 gigabits per second data transmission rate. Because the network transmitters are asynchronous each node also provides its own receiving clock for synchronizing to transmitted data signals. The frequency and phase of the receiving clock are adjusted to align with the incoming data bits so the data is captured when the bit signals are stable and not during logic level transitions when there is a higher probability of data error.

A ring oscillator circuit is used for generating the receiving clock signal because its phase and frequency can be adjusted to synchronize to the data signals. Each stage of the ring oscillator has an array of programmable delay elements which are switched on or off to add or subtract delay for adjusting the clock signal to the data signal.

A conventional programmable delay element consists of a transistor switch in series with a capacitor. When the transistor switch is turned on the capacitor is connected to the stage and provides a capacitive load for slowing it down. When the transistor switch is turned off the capacitor is disconnected from the stage, thereby speeding it up. Parasitic capacitance associated with the programmable delay element is always loading the stage, even when the transistor switch is turned off. This parasitic capacitance reduces both the maximum speed of the stage and the programming range because the switched capacitance comprises a smaller portion of the total capacitance.

A disadvantage of the conventional programmable delay element is that it requires a separate transistor switch for controlling the capacitance, which increases the component count and adds to system cost. Moreover, the transistor switch increases parasitic capacitance, thereby increasing the minimum stage delay and reducing both the programming range and the maximum oscillation frequency of the ring oscillator.

What is needed is a method for providing a programmable delay to a ring oscillator circuit that reduces cost by eliminating the need for a separate transistor switch. It would be a further benefit if the method reduced parasitic capacitance in order to provide a higher capacitance multiplication when the capacitor was enabled.

BRIEF DESCRIPTION OF THE DRAWINGS

FIG. 1 is a schematic diagram of a typical prior art programmable delay stage;

FIG. 2 is a cross-sectional view of a prior art programmable delay element;

FIG. 4 is a cross-sectional view of a switchless programmable delay element in accordance with the present invention.

DETAILED DESCRIPTION OF THE DRAWINGS

Figure 3:
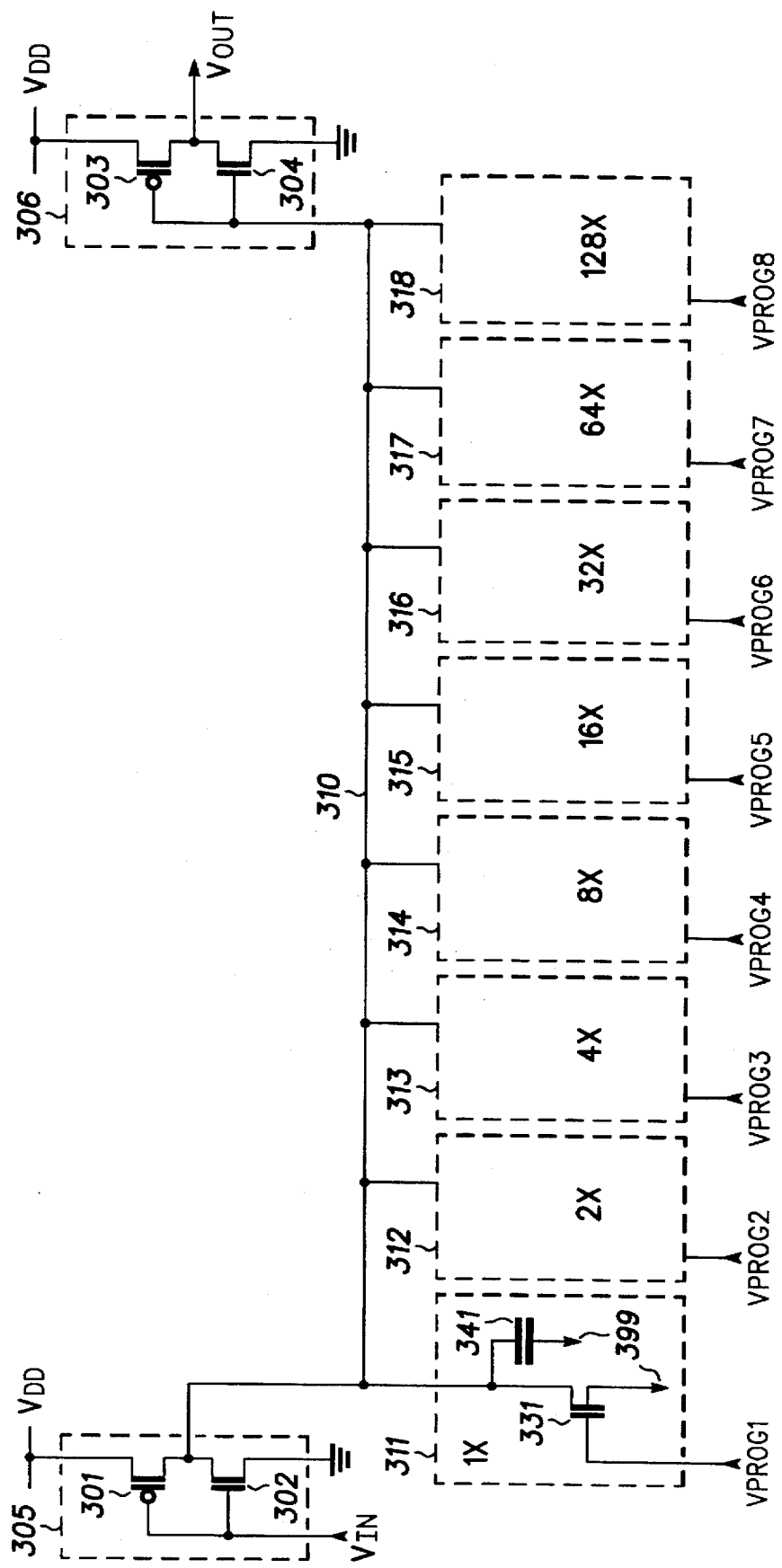
FIG. 3 is a schematic diagram of a programmable delay stage in accordance with the present invention.

Fibre channel was developed to provide efficient high speed communication between network nodes. Serial data is transmitted synchronously at a fixed rate of 1.0625 gigabits per second using fiber optic or twinaxial cable. A receiver detects logic level transitions in the transmitted data and uses them for adjusting the timing of a clock signal provided by the receiver. The clock signal is commonly produced by a ring oscillator circuit in which each delay stage is adjusted by controlling an array of programmable delay elements. The programmable delay elements produce a variable capacitive load on the stage according to a programming signal, thereby adjusting the timing of the clock signal. The clock signal typically has a frequency of 106.25 megahertz.

Previously known programmable delay elements are comprised of a capacitor and a transistor switch which enables or disables the capacitor as a load in the stage. Generally, if the programming signal contains more than one programming bit the programmable delay elements in each stage are binary scaled, each programmable delay element being controlled by a single programming bit. For example, a typical delay stage controlled by an eight bit programming signal has eight programmable delay elements which are binary scaled for loading the stage with $2^8$ or 256 equivalent unit capacitors. Each of the eight programming bits then controls from one to 128 equivalent unit capacitors.

In order to effectively switch the capacitors, the transistor switches are binary scaled along with the capacitors, so the equivalent of 256 unit transistors are also connected in the stage, ranging from a unit transistor switch to the equivalent of 128 unit transistor switches. The combination of transistor switches and capacitors results in a delay stage having a large parasitic capacitance which loads the stage regardless of the state of the transistor switches. The parasitic capacitance increases the minimum stage delay and thus lowers the maximum speed of the stage.

FIG. 1 is a schematic diagram of a typical prior art programmable delay stage 100 for providing a programmable delay in a ring oscillator or phase shifting circuit. The programmable delay stage 100 has inputs for receiving programming signals VPROG1 through VPROG8. Transistors 101 and 102 comprise an input inverter 105 which has an input connected to the gate electrodes of the transistors 101 and 102 for receiving a signal VIN. Input inverter 105 has an output at a load terminal 110 which is connected to the input of an output inverter 106.

Output inverter 106 comprises transistors 103 and 104, whose respective drain electrodes are connected for producing an output signal VOUT. One purpose of output inverter 106 is to provide gain so that VOUT has faster transition edges than the slower transition edges on load terminal 110. The source electrodes of transistors 101 and 103 are connected to a first power supply potential such as VDD and the source electrodes of transistors 102 and 104 are connected to a second power supply potential such as ground potential.

An array of programmable delay elements 111 through 118 are serially connected between load terminal 110 and a fixed power supply terminal 199 such as ground 199. The programmable delay elements 111 through 118 are generally binary weighted as shown. A typical unit programmable delay element such as programmable delay element 111 is comprised of a unit capacitor 131 connected in series with a unit transistor switch 121 whose source electrode is connected to load terminal 110. The conductive state of transistor switch 121 determines whether the capacitor 131 is coupled to load terminal 110 according to the logic state of its respective programming signal VPROG1. Similarly, each of the other programmable delay elements 112 through 118 presents a capacitive load on load terminal 110 in response to their respective programming signals VPROG2 through VPROG8.

The typical programmable delay element 111 also has a parasitic capacitance 141 connected between load terminal 110 and ground 199. The parasitic capacitance 141 is an equivalent effective capacitance whose composition varies with the particular configuration of the programmable delay element 111. It is primarily attributable to junction capacitance in the source to semiconductor substrate junction of the transistor switch 121. Parasitic capacitance 141 produces a capacitive load on load terminal 110 regardless of the state of VPROG1.

A second important parasitic capacitance 151 is the junction capacitance of the drain to semiconductor substrate junction of transistor switch 121. The parasitic capacitance 151 gets programmed along with capacitor 131 so it only produces a load on load terminal 110 when the transistor switch 121 is turned on. It has the effect of increasing the magnitude of the capacitor 131. In order for the programming signals VPROG1 through VPROG8 to linearly track the binary scaled capacitive loads throughout the programming range the transistor switch 121 must be binary scaled along with the capacitor 131, thereby binary scaling the parasitic capacitance 141. As a result, the equivalent of 256 unit transistor switches in addition to the 256 unit capacitors provide the equivalent of 256 unit parasitic capacitances 141 to load terminal 110.

The minimum delay in the programmable delay stage 100 corresponds to the magnitude of the 256 units of parasitic capacitance and occurs when all the transistor switches in the array of programmable delay elements 111 through 118 are turned off. The maximum delay occurs when all the transistor switches are turned on at which time the total capacitance corresponds to the combination of the 256 unit capacitors and the 256 unit parasitic capacitances. The parasitic capacitances reduce the high frequency performance of the programmable delay stage 100 by lowering both its overall speed and the programming range available for increasing its speed.

The programming range, from minimum to maximum delay, corresponds to the ratio of parasitic capacitance 141 to the total capacitance. In a typical conventional programmable delay stage 100 it has been observed that a total programmed capacitance is a factor of 3.5 times the aggregate parasitic capacitance.

In addition to the reduced performance of a conventional programmable delay stage 100 attributable to large parasitic capacitance, the stage has a higher cost because an extra transistor switch must be provided for each programmable delay element. The binary scaling of the transistor switches only increases the detrimental effects on cost and parasitic capacitance.

FIG. 2 is a cross-sectional view of a prior art programmable delay element 200. A semiconductor substrate 299 typically has a P-type conductivity. A source region 202 and a drain region 201 which have N-type conductivity are formed in an island at the surface of semiconductor substrate 299 which is bounded by an isolation region 203 typically comprising an insulating material such as silicon dioxide. The isolation region can be formed from a different insulating material or can comprise a region in the semiconductor substrate 299 doped differently from the semiconductor substrate 299.

The source region 202 is connected to a terminal in a delay stage for capacitively loading the terminal. A gate dielectric layer 204 is formed over the semiconductor substrate 299 in a region adjacent to the source and drain regions 202 and 201. It is typically comprised of silicon dioxide and serves as a gate dielectric over which is formed a gate electrode 208 comprised of a conductive material such as polysilicon. The source and drain regions 202 and 201 are respectively contacted for forming the source and drain electrodes of a transistor switch. A programming signal received by the gate electrode 208 controls the formation of an inversion layer 206 under the gate electrode 208. The inversion layer 206 is of the same doping type as the source and drain regions 202 and 201 and provides a conductive path between them when the transistor switch is turned on.

The drain region 201 is extended under a capacitor dielectric layer 210 which is formed over a region of the semiconductor substrate 299 adjacent to the drain region 201. The extension of the drain region 201 comprises the capacitor plate which is connected to the drain of the transistor switch. The capacitor dielectric layer is commonly comprised of an insulating material such as silicon dioxide. A plate 205 of the capacitor is comprised of a conductive material such as aluminum or polysilicon which is formed over the capacitor dielectric layer 210 and is generally connected to a power supply potential such as a ground potential. The capacitance of the capacitor is a parallel combination of a metal substrate capacitance produced between the extension of the drain region 201 and the plate 205, which corresponds to the area of the capacitor dielectric layer 210, and a junction capacitance between the extended drain region 201 and the semiconductor substrate 299.

FIG. 3 is a schematic diagram of a programmable delay stage 300 in accordance with the present invention. Transistors 301 and 302 form an input inverter 305 which has an input connected to the gate electrodes of the transistors 301 and 302 for receiving an input signal VIN. Input inverter 305 has an output at load terminal 310 which is connected to the input of an output inverter 306. Output inverter 306 comprises transistors 303 and 304 and is used for providing gain for speeding up the slow transition edge on load terminal 310. The source electrodes of transistors 301 and 303 are connected to a first power supply potential such as VDD and the source electrodes of transistors 302 and 304 are connected to a second power supply potential such as ground potential. A semiconductor substrate 399 is connected to a power supply potential such as a ground potential.

Eight switchless programmable delay elements 311 through 318 have inputs for receiving respective programming signals VPROG1 through VPROG8. Although the embodiment shown has eight switchless programmable delay elements, a different number can be used in a particular application. The switchless programmable delay elements 311 through 318 are generally binary weighted, although they can be equally weighted or weighted in another fashion.

A typical switchless programmable delay element 311 has only one component, an inversion capacitor 331, but it functions in much the same way as a conventional delay element. It does not require an extra transistor switch. Inversion capacitor 331 has a first electrode connected to load terminal 310 and a second electrode connected to programming signal VPROG1. It produces a capacitive load on load terminal 310 which is enabled in response to VPROG1.

A parasitic capacitance 341 attributable to junction capacitance between the first electrode and the semiconductor substrate 399 is present to load terminal 310. However, there is no need to scale the parasitic capacitance 341 in a binary fashion to provide accurate programming control of the switchless programmable delay elements 311 through 318 because it is not a switched capacitance; rather, it is always loading the load terminal 310. And while it affects the minimum delay of the programmable delay stage 300 it does not affect the programming range. Moreover, there is more opportunity to reduce the parasitic capacitance associated with the switchless programmable delay element 311 because there is only one component to be laid out on a semiconductor die. For example, the first electrode of the inversion capacitor 331 can be shared among adjacent switchless programmable delay elements, thereby reducing the aggregate parasitic capacitance in the stage and raising its maximum speed.

FIG. 4 is a cross-sectional view of a switchless programmable delay element 400 in accordance with the present invention. A semiconductor substrate 499 typically has a P-type conductivity. A single contact region 402 having N-type conductivity is formed in a portion of an island in the semiconductor substrate 499 which is bounded by an isolation region 403. The single contact region 402 generally comprises a minimum feature size in order to minimize its associated junction capacitance. The junction capacitance is further reduced because the single contact region can be shared with other switchless programmable delay elements more easily than with the conventional methods because the switchless programmable delay element 400 has only one component and two electrodes.

The isolation region 403 typically comprises an insulating material such as silicon dioxide. Alternatively, the isolation region can be formed from a different insulating material or can comprise a region having a different doping type or concentration as that of the semiconductor substrate 499. Still other methods for forming an isolation region 403 in a semiconductor substrate 499 are known or may occur to those skilled in the art.

A dielectric layer 404 is formed over the island in the semiconductor substrate 499 in a region adjacent to the single contact region 402. It is typically comprised of silicon dioxide but can be formed from another insulating material. A contact layer 408 is formed over the dielectric layer 404 and is comprised of a conductive material such as polysilicon, although it can alternatively be comprised of a metal such as aluminum or platinum or of another conductive material.

A programming signal received by the contact layer 408 controls whether an inversion layer 406 is formed under the dielectric layer 404. The inversion layer 406 is of the same conductivity type as the single contact region 402 and is electrically connected to it, thereby effectively multiplying the area of the junction between the single contact region 402 and the semiconductor substrate by a factor corresponding to the junction area of the inversion layer 406. The junction capacitance of the single contact region 402 is accordingly multiplied by the same factor. In addition, a dielectric capacitance is produced between the contact layer 408 and the inversion layer 406. This capacitance is in parallel with the junction capacitance from the inversion layer 406 and corresponds to the area of the inversion layer 406, further increasing the capacitance multiplication factor. A multiplication factor of 10 has been observed using the switchless programmable delay element 400, in contrast to the factor of 3.5 seen with a conventional method.

By now it should be appreciated that a method has been provided for multiplying a capacitance in response to a programming signal. A contact region of a first conductivity type is formed in a semiconductor substrate of a second conductivity type. The capacitance is produced at the junction between the contact region and the substrate and corresponds to the area of the junction. A dielectric layer is formed over the substrate adjacent to the contact region and a conductive layer is formed over the dielectric layer. The conductive layer receives a programming signal which controls the formation of an inversion layer under the conductive layer. The inversion layer is electrically connected to the contact layer and effectively multiplies the area of the contact layer by a multiplication factor. An inversion capacitance is produced at the junction of the inversion layer and substrate which corresponds to a multiplication of the capacitance by the multiplication factor.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

We claim:

1. A switchable capacitor, comprising:

a substrate;

a first doped region formed in the substrate;

a dielectric layer overlaying the substrate adjacent to the first doped region; and a conductive material disposed on the dielectric layer for forming an inversion layer in the substrate which extends from the first doped region under the conductive material to produce a capacitance with the substrate, where the substrate is devoid of a second doped region adjacent to the inversion layer.

2. The switchable capacitor of claim 1, wherein the substrate and the first doped region have different conductivity types.

3. The capacitor of claim 1, wherein the capacitance includes a junction capacitance of the inversion layer.

4. A method of multiplying capacitance, comprising the steps of:

biasing a substrate with a first power supply voltage;

biasing a first doped region of the substrate to a second power supply voltage to form a first capacitance; and inverting a region of the substrate extending from the first doped region to form a second capacitance as a multiple of the first capacitance.

5. The method of claim 4, wherein the first doped region and the substrate have different conductivity types.

6. The method of claim 4, wherein the step of biasing the first doped region includes the step of forming a junction of the first doped region and the substrate to produce the first capacitance.

7. The method of claim 4, wherein the step of inverting further includes the step of producing the second capacitance at a junction of the inversion layer and the substrate.

8. The method of claim 4, wherein the step of inverting includes the step of inverting the region of the substrate with a control signal.

9. The method of claim 8, wherein the step of inverting the region of the substrate with a control signal includes the step of applying the control signal to the substrate through a dielectric layer.

10. The method of claim 9, wherein the dielectric layer is formed between the substrate and a conductive layer and the step of applying the control signal includes the step of applying the control signal to the conductive layer.

11. A programmable delay stage, comprising:
- an inverter having an input coupled for receiving an input signal and an output for providing an output signal; and
- a switchable capacitor coupled to the output of the inverter for delaying the output signal, the switchable capacitor comprising
  (1) a substrate coupled to a power supply conductor,
  (2) a first doped region formed in the substrate and coupled to the output of the inverter,
  (3) a dielectric layer overlaying the substrate adjacent to the first doped region, and
  (4) a conductive material disposed on the dielectric layer for receiving a control signal to form an inversion layer in the substrate under the conductive material and extending from the first doped region, where the substrate is devoid of a second doped region adjacent to the inversion layer.

12. The programmable delay stage of claim 11, wherein the first doped region and the substrate have opposite conductivity types.

13. The programmable delay stage of claim 11, wherein an inversion capacitance is formed in a junction of the inversion layer and the substrate.

14. The switchable capacitor of claim 1, wherein the substrate is devoid of a conduction path from the first doped region through the inversion layer to the second doped region.

15. The switchable capacitor of claim 1, wherein a control signal is applied to the conductive material to form the inversion layer.

16. The method of claim 4, wherein the substrate is devoid of a second doped region adjacent to the first doped region.

17. A method of multiplying capacitance, comprising the steps of:
- biasing a substrate with a first power supply voltage;
- biasing a first doped region of the substrate to a second power supply voltage to form a first capacitance; and
- inverting a region of the substrate to produce an inversion layer extending from the first doped region to form a second capacitance that is a multiple of the first capacitance, where the substrate is devoid of a second doped region adjacent to the inversion layer.

* * * * *